United States Patent [19]

Stanley

[11] 4,158,820
[45] Jun. 19, 1979

[54] LOW LEVEL PREAMPLIFIER CIRCUIT
[75] Inventor: Gerald R. Stanley, Mishawaka, Ind.
[73] Assignee: Crown International, Inc., Elkhart, Ind.
[21] Appl. No.: 874,040
[22] Filed: Feb. 1, 1978
[51] Int. Cl.² .......................... H03F 1/26; H03F 3/183
[52] U.S. Cl. ................................... 330/149; 330/265; 330/267; 330/294; 330/304
[58] Field of Search ............... 330/149, 263, 265, 267, 330/268, 294, 295, 302, 304; 179/1 A, 1 P

[56] References Cited

U.S. PATENT DOCUMENTS

| | | | |
|---|---|---|---|
| 2,762,870 | 5/1956 | Sziklai et al. | 330/267 |
| 2,802,067 | 8/1957 | Zawels | 330/267 |
| 4,035,737 | 7/1977 | Curl | 330/263 |

FOREIGN PATENT DOCUMENTS 313280 11/1971 U.S.S.R. .................................. 330/263

Primary Examiner—James B. Mullins
Attorney, Agent, or Firm—Oltsch, Knoblock & Hall

[57] ABSTRACT

In a low level audio preamplifier circuit having complementary connected PNP and NPN bipolar transistors for receiving the audio input from a low level transducer such as a tape head, in which induced distortion from externally generated radio frequency energy is cancelled with minimal loss of audio fidelity.

3 Claims, 2 Drawing Figures

LOW LEVEL PREAMPLIFIER CIRCUIT

SUMMARY OF THE INVENTION

This invention relates to a preamplifier circuit and will have specific application to those preamplifiers for receiving low level audio inputs.

Heretofore low level audio preamplifiers which were designed for use with such transducers as magnetic tapes heads and velocity sensing phonograph cartridges have been frequently plagued by RF signals from CB operators, ham operators and some types of TV transmissions. Such RF signals overdrive the bipolar transistor of the first or input stage of the amplifier circuit resulting in AM demodulation and distortion.

In this invention, a second bipolar transistor is complementary connected to the usual bipolar transistor of the input stage of the preamplifier to produce two complementary RFI signals which are cancelled upon their summation.

Accordingly, it is an object of this invention to provide a low level audio preamplifier circuit which minimizes RFI induced distortion.

Another object of this invention is to provide a low level audio preamplifier circuit which includes an RFI filter for improved RFI suppression with minimum loss of fidelity.

Another object of this invention is to provide a low level audio preamplifier circuit which reduces base-collector feedback to the input source and which utilizes an operational amplifier for high slew rate and minimum distortion.

Other objects of this invention will become apparent upon a reading of the invention's description.

DESCRIPTION OF THE PREFERRED EMBODIMENTS

The preferred embodiments illustrated are not intended to be exhaustive or to limit the invention to the precise forms disclosed. They are chosen and described in order to best explain the principles of the invention and its application and practical use to thereby enable others skilled in the art to best utilize the invention.

Figure 1:
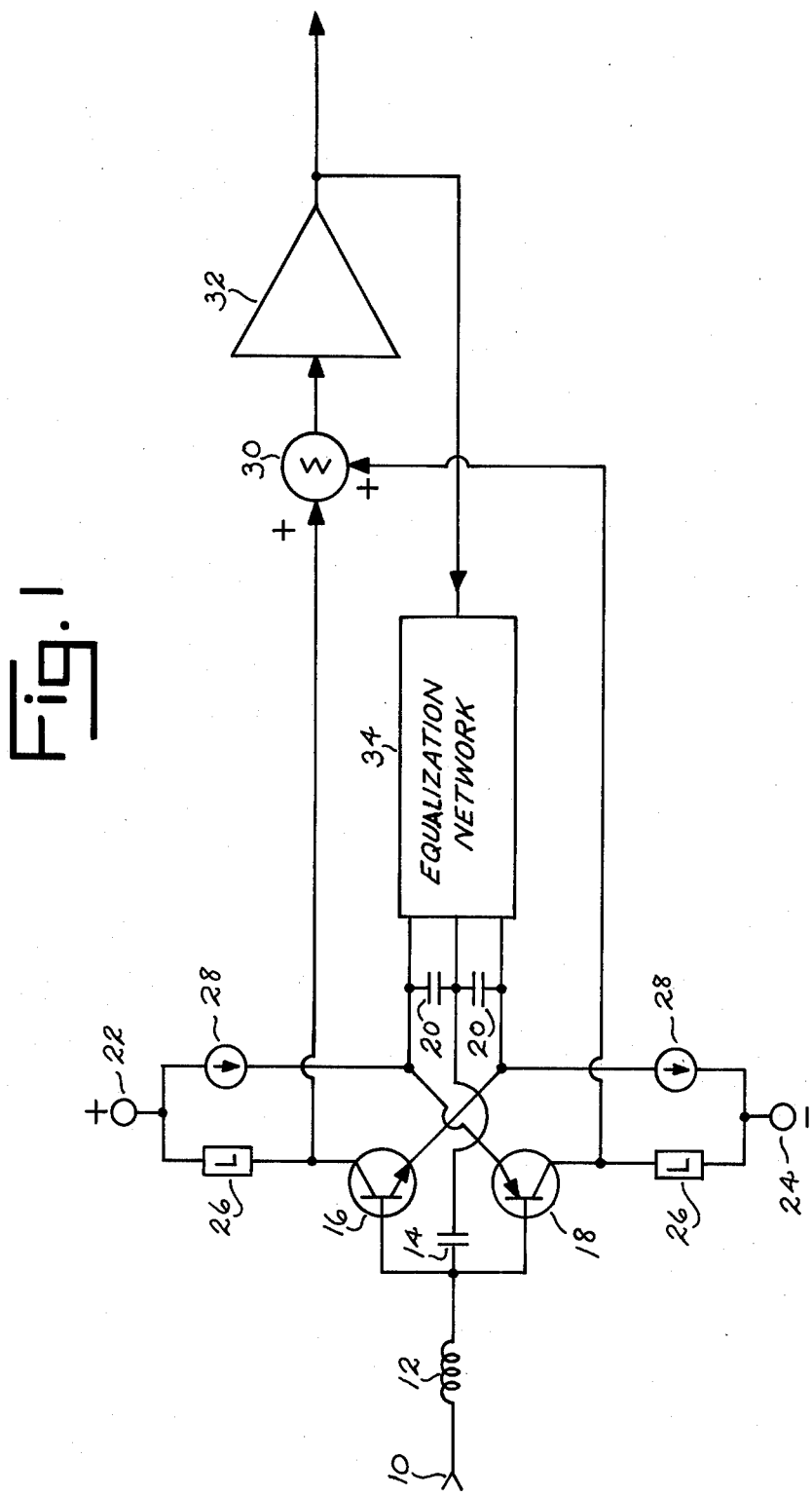
FIG. 1 is illustrative of a basic circuit depicting the invention.

Referring to the simplified circuit shown in FIG. 1, input terminal 10 is coupled to a low level transducer (not shown), such as a tape head, phonographic cartridge, microphone or guitar pickup. A coil 12 and a capacitor 14 connected in series to input terminal 10 can serve as one medium for suppression of RF signals. Connected within the circuit of FIG. 1 is an NPN bipolar transistor 16 and a PNP bipolar transistor 18. The bases of transistors 16 and 18 are connected in AC and DC common with the emitters of the transistors being connected in AC common through capacitors 20. DC voltage sources 22 and 24 of the polarity shown in conjunction with loads 26, such as resistors, and current sources 28, such as resistors, bias transistors 16 and 18 in a Class A mode.

The audio signal output passes from the collectors of transistors 16 and 18 to a summing junction 30. The summing junction 30 is connected to an operational amplifier 32 whose output terminal is connected into an amplifier circuit (not shown) of the audio system. An equalization network 34 is connected between the output of operational amplifier 32 and the emitters of transistors 16 and 18 at connecting capacitors 20 to provide negative feedback. The purpose of equalization network 34 is to provide the desired frequency response and gain while minimizing distortion of the preamplifier circuit.

During normal transmission, the input signal passes through coil 12 to the bases of transistors 16 and 18 and through their respective collectors as in phase signals to summing junction 30. The summed signal then passes into operational amplifier 32 and from the operational amplifier into a connected amplifier circuit of the audio system. Upon RF reception complementary RFI distortion signals are formed in the collectors of transistors 16 and 18 to produce out-of-phase signals at junction 30, resulting in a cancellation of the RFI signal and its induced distortion. By virtue of this operation of transistors 16 and 18, normal audio signals are summed directly to produce twice the collector output while RFI induced distortion is substantially cancelled.

Further, coil 12 and capacitor 14 form an improved RFI filter with the capacitor being deployed across the base-to-the-emitter junctions of transistors 16 and 18. In the normal frequency range, capacitor 14 has no appreciable AC voltage across it. Capacitor 14 is designed to become operative only in the RF frequency range at which time it forms an RF signal shunt into equalization network 34.

Figure 2:
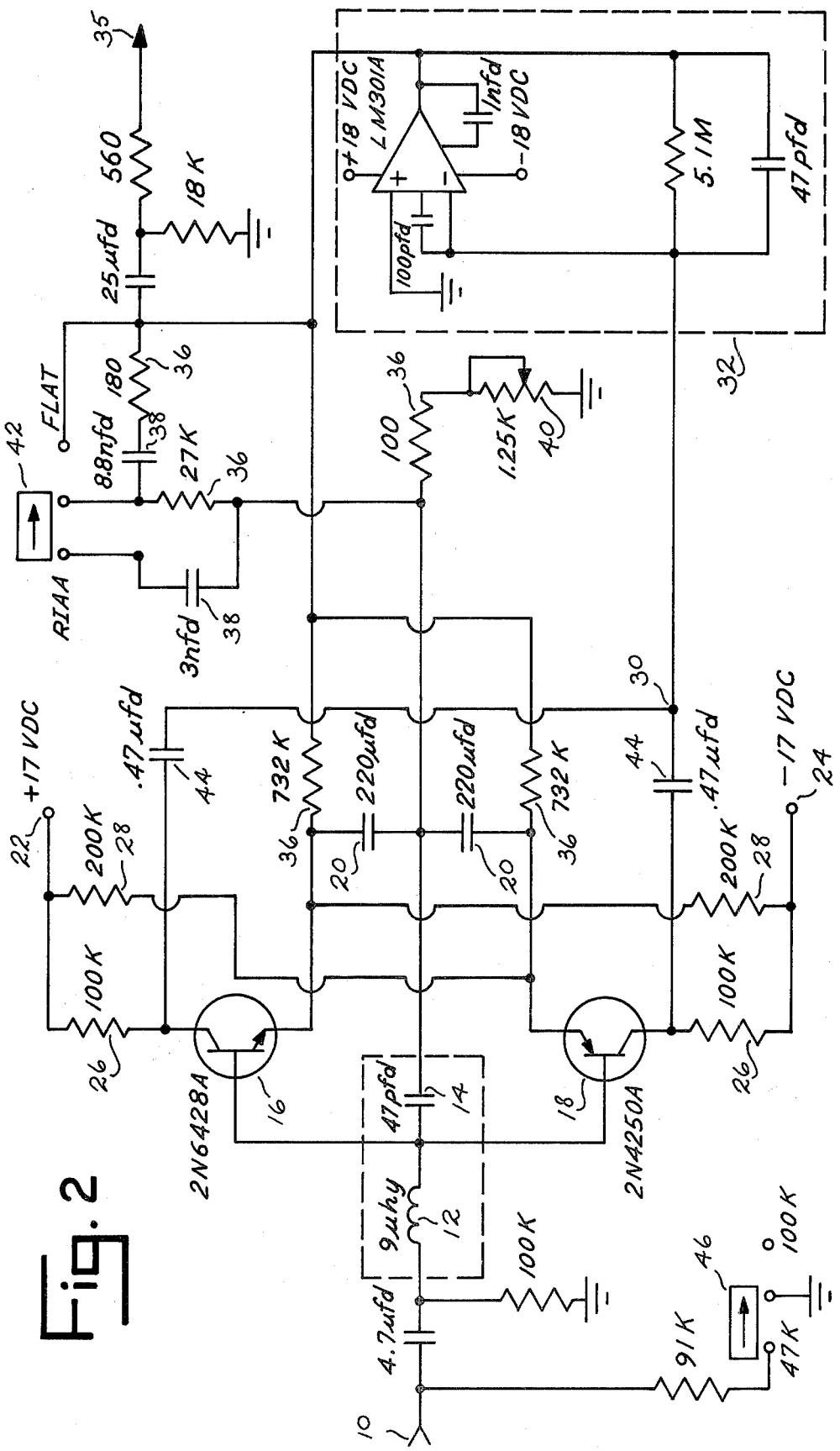
FIG. 2 is a complete preamplifier circuit incorporating the invention.

FIG. 2 is illustrative of a detailed preamplifier circuit incorporating the above inventive aspects described with respect to the general circuit diagram of FIG. 1. The circuit of this figure includes those components previously described for the circuit of FIG. 1 which are numbered correspondingly. The circuit for operational amplifier 32 is enclosed within the broken line box indicated by the reference numeral 32. The equalization network includes resistors 36, capacitors 38, and rheostat 40 which serves as a gain adjustment. Switch 42 which also forms a part of the equalization network serves to change the preamplifier frequency response and is of common usage in the art.

Transistors 16 and 18 complement one another to cancel RFI induced distortion as previously explained for FIG. 1. RFI filter components 12 and 14 operate functionally similar as in the previously described circuit of FIG. 1. The summing junction for the collectors of transistors 16 and 18 as designated by reference numeral 30 is, in its simpliest form, a connection or node. Blocking capacitors 44 are located between summing junction 30 and the collectors of transistors 16 and 18. Blocking capacitors 44 cause operational amplifier 32 to form a virtual ground at summing junction 30, thereby reducing base-to-collector feedback of transistors 16 and 18.

Output terminal 35 is connected to the amplifier circuit (not shown) for the audio system. A switch 46 is utilized to change input impedance of the preamplifier circuit.

It is to be understood that the invention is not to be limited to the details above given but may be modified within the scope of the appended claims.

What I claim is:

1. A low level preamplifier circuit for an audio input comprising an NPN bipolar transistor, a PNP bipolar transistor, an operational amplifier, the bases of said transistors connected in AC common for receiving the audio input, the emitters of said transistors connected in an AC common, means for similarly biasing said transistor emitters, the collectors of said transistors being connected in a summing mode to the input terminal of said operational amplifier, whereby RFI input into said transistor bases generates complementary cancelling distortion in said transistor collectors, and an equalization network means for controlling frequency response and gain by use of negative feedback, said equalization network means connected between the output of said operational amplifier and the emitters of said transistors, said transistor emitters connected in AC common with said equalization network means.

2. A low level preamplifier circuit for an audio input comprising an NPN bipolar transistor, a PNP bipolar transistor, an operational amplifier, the bases of said transistors connected in AC common for receiving said input from an audio source, the emitters of said transistors connected in an AC common, means for similarly biasing said transistor emitters, the collectors of said transistors being connected in a summing mode to the input terminal of said operational amplifier, whereby RFI input into said transistor bases generates complementary cancelling distortion in said transistor collectors, and a RFI filtering coil connected between said source and the bases of said transistors, a RFI filtering capacitor connected in series with said filtering coil between said transistor bases and transistor emitters at their AC common connection.

3. The preamplifier circuit of claim 1 or 2 and a pair of positive and negative complementary DC supply sources, said transistor emitters biasing means including a first resistor means connected between the negative DC supply source and the emitter of said NPN transistor and a second resistor means connected between the positive DC supply source and the emitter of said PNP transistor.

* * * * *